(12) United States Patent
Gardner et al.

(10) Patent No.: US 9,472,288 B2
(45) Date of Patent: Oct. 18, 2016

(54) MITIGATING PARASITIC CURRENT WHILE PROGRAMMING A FLOATING GATE MEMORY ARRAY

(71) Applicant: Hewlett-Packard Development Company, L.P., Houston, TX (US)

(72) Inventors: James Michael Gardner, Corvallis, OR (US); Eric T. Martin, Corvallis, OR (US); Daryl E. Anderson, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 14/527,466

(22) Filed: Oct. 29, 2014

(65) Prior Publication Data

US 2016/0125943 A1 May 5, 2016

(51) Int. Cl.
| | |
|---|---|
| *G11C 16/10* | (2006.01) |
| *G11C 16/30* | (2006.01) |
| *G11C 16/04* | (2006.01) |
| *G11C 16/08* | (2006.01) |
| *G11C 16/12* | (2006.01) |
| *G03G 21/18* | (2006.01) |

(52) U.S. Cl.
CPC ........... *G11C 16/10* (2013.01); *G11C 16/0408* (2013.01); *G11C 16/08* (2013.01); *G11C 16/12* (2013.01); *G11C 16/30* (2013.01); *G03G 21/1882* (2013.01)

(58) Field of Classification Search
CPC ... G11C 16/10; G11C 16/30; G11C 16/0408; G03G 15/5004
USPC ............ 365/185.06, 185.15, 185.25, 185.26, 365/185.31
See application file for complete search history.

(56) References Cited

U.S. PATENT DOCUMENTS

| | | | |
|---|---|---|---|
| 6,252,802 B1 | 6/2001 | Kramer et al. | |
| 6,937,521 B2 | 8/2005 | Avni et al. | |
| 7,046,549 B2 | 5/2006 | Lee et al. | |
| 7,345,915 B2 | 3/2008 | Benjamin | |
| 7,365,387 B2 | 4/2008 | Benjamin | |
| 7,835,186 B2 | 11/2010 | Ratnakumar et al. | |
| 7,944,749 B2 | 5/2011 | Lee et al. | |
| 7,952,929 B2* | 5/2011 | Kim ................... | G11C 16/0483 365/185.17 |
| 2007/0194371 A1* | 8/2007 | Benjamin ............ | B41J 2/04541 257/320 |
| 2008/0186776 A1* | 8/2008 | Kim ................... | G11C 16/0483 365/185.23 |

(Continued)

OTHER PUBLICATIONS

Jordan D. Gray, Application of Floating-Gate Transistors in Field Programmable Analog Arrays, Thesis, Dec. 2005, 66 pages, School of Electrical and Computer Engineering Georgia Institute of Technology.

*Primary Examiner* — Richard Elms
*Assistant Examiner* — Jerome Leboeuf
(74) *Attorney, Agent, or Firm* — Hanley Flight & Zimmerman, LLC

(57) ABSTRACT

Methods to program a floating gate memory array include, in response to a request to program a second bit of the floating gate memory array, at a first time, outputting a programming voltage to cause a first node voltage at a first source of a first transistor corresponding to a first bit, wherein the first node voltage is greater than a second node voltage at a second source of a second transistor corresponding to the second bit. The method further includes at a second time, increasing the programming voltage of the floating gate memory array to program the second bit of the floating gate memory array.

15 Claims, 13 Drawing Sheets

(56) References Cited

U.S. PATENT DOCUMENTS

2013/0051147 A1\* 2/2013 Iwai .................... G11C 11/5628
  365/185.17

2014/0374812 A1\* 12/2014 Ge ...................... H01L 29/7881
  257/316

\* cited by examiner

MITIGATING PARASITIC CURRENT WHILE PROGRAMMING A FLOATING GATE MEMORY ARRAY

BACKGROUND

Many printing devices utilize a printing cartridge that includes memory used to store information on the printing cartridge. For example, the memory may be implemented by a Floating Gate Avalanching Metal Oxide Semiconductor (FAMOS) memory array. The memory may be utilized to store information about the printing cartridge and/or printing operations such as, for example, temperature information, traceability information, page counting information, information about a type of fluid in the cartridge, calibration data, error information, and/or other data.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
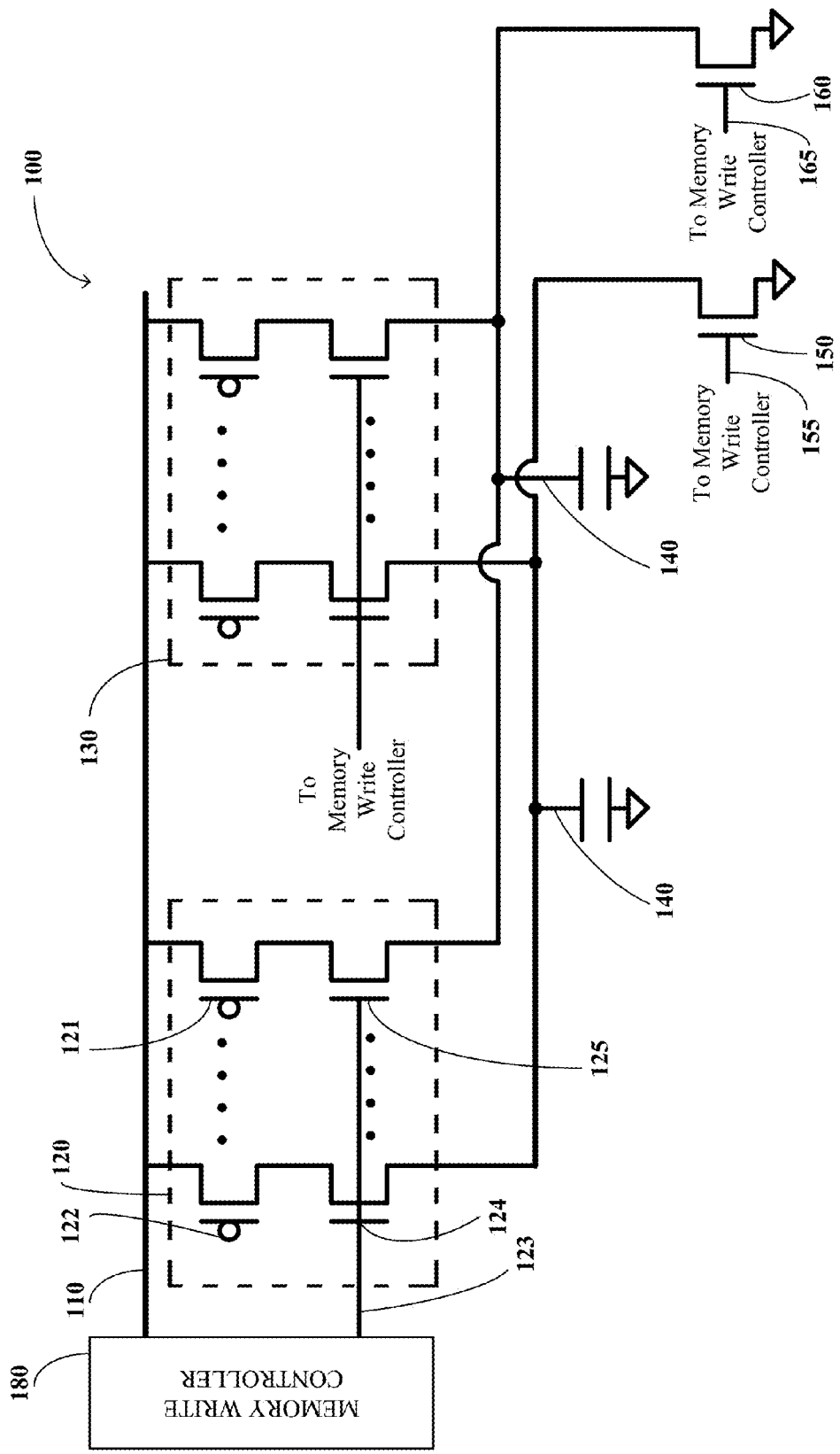
FIG. 1 is a schematic diagram of an example FAMOS memory array.

Many printing systems utilize a cartridge or similar element that holds a printing substance (e.g., ink for inkjet printing, toner for laser printing, etc.). Such cartridges may include a memory for storing information. This memory may be implemented by a Floating-gate Avalanche-injection Metal Oxide Semiconductor (FAMOS) memory array. FAMOS memory arrays typically include a conductive grid of columns and rows of semi-conductive material. A FAMOS memory bit within the FAMOS memory array is a p-doped metal oxide semiconductor (PMOS) transistor that includes a gate element that is isolated in a thin oxide layer that acts as a dielectric. This isolated gate element is called a floating gate. A FAMOS memory bit is considered unprogrammed when the floating gate has no charge and the FAMOS memory bit acts like a high resistance switch, causing excited electrons to flow into the floating gate programs the FAMOS memory bit. Once programmed, the FAMOS memory bit acts like a low resistance switch and allows current to flow through the FAMOS memory bit.

To write (e.g., program) a FAMOS memory bit, a programming voltage $V_{prog}$ 110 is set to a write voltage level $V_{write}$ (e.g., 10V), which is applied to a source of the FAMOS memory bit that is to be written. $V_{write}$ is sufficient to cause excited electrons to be pushed through a thin oxide layer and trapped on the other side of the thin oxide layer of the floating gate giving the FAMOS memory bit a negative charge. This flow of electrons is known as an avalanching injection current.

Once the FAMOS memory bit has been programmed by an avalanching injection current, a lower programming read voltage level $V_{read}$ (e.g., 5V) will cause current to flow through the FAMOS memory bit. To read the FAMOS memory bit, the programming voltage $V_{prog}$ 110 is set to the read voltage level $V_{read}$ and a bit sensor monitors the current through the bit. If little current (e.g., nanoamps of current) flows, the bit is identified as '1' or unprogrammed. If measureable current (e.g., milliamps of current) flows, the bit is identified as '0' or programmed. Alternatively an unprogrammed bit can be identified as '0' and a programmed bit can be identified as '1.'

FAMOS memory arrays are known for their flexibility and low cost per bit design. FAMOS memory arrays also have excellent programming retention for data reliability. However, if a non-erasable FAMOS memory bit is inadvertently programmed, the bit and/or the entire printing cartridge containing the FAMOS memory array may be discarded. In some instances, a first bit of a FAMOS memory array may be inadvertently programmed (e.g., the first bit, which was not intended to be programmed, may be moved to the programmed state) during programming of a second bit of the FAMOS memory array. For example, rapidly establishing a programming voltage (e.g., by substantially instantaneously setting the programming voltage to a high level (e.g., 10V) may cause inadvertent programming of bits of the FAMOS memory array that are not selected for programming (e.g., non-selected bits). Inadvertent programming is described in further detail in conjunction with FIG. 1. Methods and apparatus disclosed herein facilitate programming of a FAMOS memory array while avoiding the technical problem of inadvertent programming of bits of the FAMOS memory array.

FIG. 1 is a schematic diagram of an example FAMOS memory array 100. The example FAMOS memory array 100 comprises two memory blocks 120, 130, but may contain any number of memory blocks (e.g., 1, 2, 64, 128, etc.). The memory block 120 comprises FAMOS memory bits 121, 122 and corresponding n-doped metal oxide semiconductor (NMOS) row select transistors 124, 125. The memory block 120 of the illustrated example comprises the two FAMOS memory bits 121, 122, but may contain any number of FAMOS memory bits within a given the memory block. For example, the memory block 120 may comprise eight FAMOS memory bits such that the memory block 120 comprises a byte (e.g., 8 bits).

The example FAMOS memory bits 121, 122 of FIG. 1 are implemented by FAMOS transistors. The example FAMOS memory bits 121, 121 comprise a floating gate and a semiconductor substrate comprising a source and a drain. The example floating gate is isolated from the semiconductor substrate by a dielectric material (e.g., silicon dioxide (SiO$_2$)) surrounding the floating gate. Applying a high voltage (e.g., 10V) between the example source and the example drain of one of the FAMOS memory bits 121, 121 generates an electric field that charges or energizes electrons (forming "hot" electrons) in the FAMOS memory bit 121, 122. Some of these hot electrons transfer ("jump") from a p doped region across the dielectric material to the floating gate. As electrons are driven onto the example floating gate, the threshold source-to-drain voltage of the example FAMOS memory bit 121, 122 (e.g., the source-to-drain voltage to cause current to flow from the source to the drain) decreases. If a sufficient quantity of electrons is driven onto the floating gate, the FAMOS memory bit 121, 122 is depleted (e.g., programmed). When the example FAMOS memory bit 121, 122 is programmed and a low voltage level (e.g. 5V) is applied to the source of the FAMOS memory bit 121, 122, the FAMOS memory bit 121, 122 has a source-to-drain current flow (e.g., 50-250 μA) substantially higher than a source-to-drain current flow (e.g., nanoamps) in an unprogrammed FAMOS memory bit. Thus, the programmed state may be used to indicate a bit value (e.g., digital 0) and the unprogrammed state may be used to indicate a different bit value (e.g., digital 1). Alternatively, any other correlation between states and bit values may be utilized.

In the illustrated example, the sources of the FAMOS memory bits 121, 122 are connected to a voltage regulator, which is capable of outputting a programming voltage V$_{prog}$ 110. The drains of the FAMOS memory bits 121, 122 are connected to drains of the corresponding NMOS row select transistors 124, 125. The row select transistors 124, 125 are used to select the memory block 120 for reading or writing (e.g., the memory block 120 is selected by switching the NMOS row select transistors 124, 125 on using a row select line 123). Sources of the example row select transistors 124, 125 are connected to drains of corresponding column transistors 150, 160. The column transistors 150, 160 are used to select a specific FAMOS memory bit (e.g., the FAMOS memory bit 122 is selected by switching the NMOS column select transistor 150 on using a column select line 155) within the memory blocks selected by the row select line 123 (e.g., the memory block 120).

For example, to program the example FAMOS memory bit 122, the programming voltage V$_{prog}$ 110 is set to a write voltage level V$_{write}$ (e.g., 10V). To direct a current resulting from the programming voltage V$_{prog}$ 110 through the FAMOS memory bit 122 that is to be programmed, the row select line 123 activates the NMOS row select transistors 124, 125 in the memory block 120. Additionally, the example column select line 155 activates the example column transistor 150, which creates a ground path associated with the example FAMOS memory bit 122. Accordingly, the example FAMOS memory bit 121 will not be inadvertently programmed because the example column select transistor 160 is not activated (e.g., example line select 165 will not be enabled). When the column select transistor 160 is not activated, the column select transistor 160 acts like an open circuit with no path to ground. Similarly, the FAMOS memory bits from the example memory block 130 (as well as FAMOS memory bits from any other memory block) will not be programmed because row select transistors associated with memory block 130 will not be activated. In the example, one FAMOS memory bit is programmed at a time, alternatively multiple FAMOS memory bits and/or multiple memory blocks may be programmed at the same time by activating different sets of row select transistors and column select transistors while the programming voltage V$_{prog}$ 110 is set to the write voltage level V$_{write}$.

To sense (e.g., read) the condition of the FAMOS memory bit 122, the programming voltage V$_{prog}$ 110 is pulsed to a read voltage level V$_{read}$ (e.g. 5V). To direct current resulting from the programming voltage V$_{prog}$ 110 through the FAMOS memory bit 122 to be read, the row select line 123 activates the NMOS row select transistors 124, 125 in memory block 120. Additionally, the example column select line 155 activates the example column transistor 150, which creates a ground path associated with the example FAMOS memory bit 122. The current through the FAMOS memory bit 122 is monitored by a bit current sensor that may be located at any node on the path toward ground. If little current (e.g., nanoamps of current) flows, the bit is identified as '1' or unprogrammed. If measureable current (e.g., milliamps of current) flows, the bit is identified as '0' or programmed. Alternatively, an unprogrammed bit could be identified as '0' and a programmed bit could be identified as '1' or any other states could be utilized.

According to the illustrated example, one FAMOS memory bit is read at a time. Alternatively, multiple FAMOS memory bits may be read at the same time by monitoring multiple bit sensors after activating multiple column select transistors while the programming voltage Vprog 110 is set to the read voltage level V$_{read}$.

Due to the proximity of the transistors 150, 160 a parasitic capacitance exists between components of the transistors 150, 160. The example schematic diagram of FIG. 1 includes example capacitors 140 (e.g., parasitic capacitors) that represent parasitic (e.g., stray) capacitance present in the example FAMOS memory array 100. These parasitic capacitors 140 are not physical capacitors that are located in the circuit. Rather, the parasitic capacitors 140 are representative of the parasitic capacitance that occurs within FAMOS memory arrays such as the example FAMOS memory array 100.

Parasitic capacitance within the example FAMOS memory array 100 may allow parasitic current flow within the FAMOS memory array 100. The parasitic current flow is proportional to the parasitic capacitance and the rate of change for a voltage $$\left(i = C\frac{dv}{dt}\right).$$

While the programming voltage V$_{prog}$ 110 is typically pulsed during a write operation, causing $$\frac{dv}{dt}$$

to be relatively high, if the parasitic capacitance is low enough, the parasitic current is negligible. However, the parasitic capacitance of the FAMOS memory array 100 increases with the size of the FAMOS memory array 100 (e.g., with increasing number of memory blocks). As the parasitic capacitance increases, the parasitic current increases. If the parasitic current grows large enough, the parasitic capacitance may provide a low impedance path to ground. If a low impedance path to ground is provided for the example FAMOS memory bit 121 that is not to be written, the parasitic current flow may result in inadvertent programming of the example FAMOS memory bit 121 (or another bit that is not intended to be programmed). For example, a programming voltage $V_{prog}$ 110 that is pulsed to 10 Volts (V) may induce an avalanching injection current in one of the FAMOS memory bits 121, 122 due to parasitic current flow even when the column select transistor 155, 165 is not activated. Example methods and apparatuses disclosed herein address this problem of unintentional programming of bits due to parasitic capacitance of the FAMOS memory array 100.

The example FAMOS memory array 100 of FIG. 1 is programmed by an example memory write controller 180. The example memory write controller 180 controls the signals output to the programming voltage $V_{prog}$ 110 the example row select line 123, and the example column select lines 155, 165. In some examples, the FAMOS memory array 100 of FIG. 1 controls the outputs to ensure that a node voltage at the drain of the column select transistor 150, 160 that is not to be programmed (e.g., the example column select transistor 160) is greater than a node voltage at the drain of the column select transistor 150, 160 that is not to be programmed (e.g., the example column select transistor 150). In some examples, the memory write controller 180 controls the node voltage to prevent the inadvertent programming of FAMOS memory bits 121, 122 that are not selected for programming. Example implementations of the memory write controller 180 are described in conjunction with FIGS. 2, 6, and 8-11.

Figure 2:
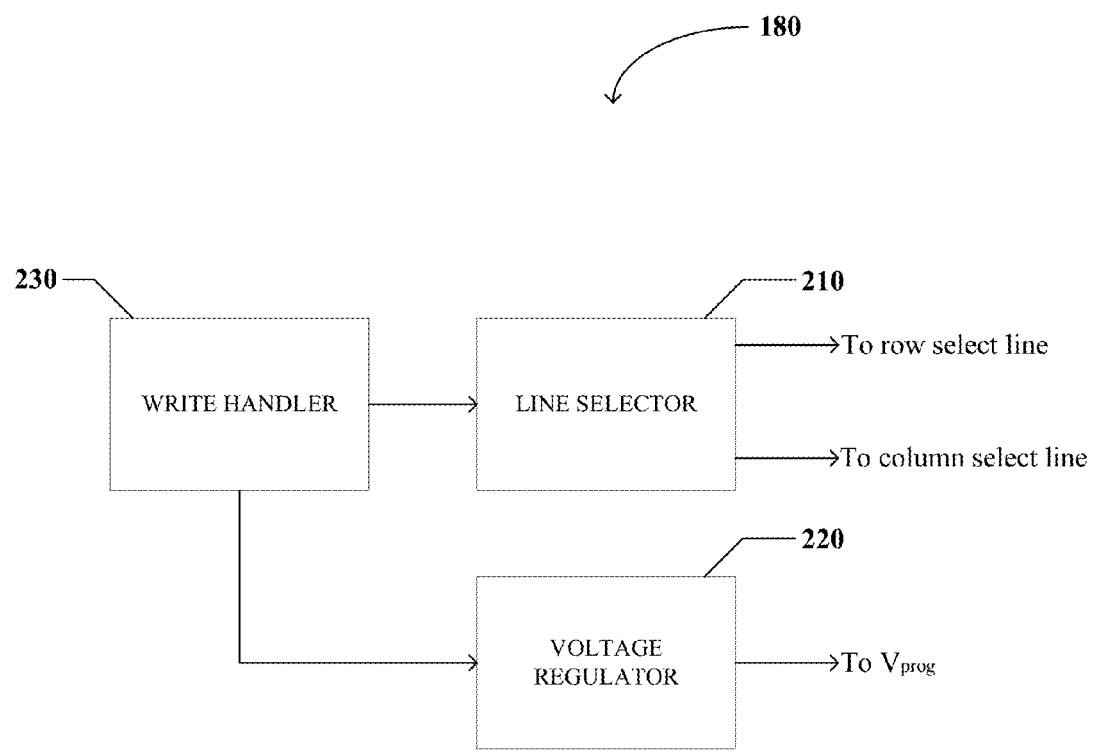
FIG. 2 is a block diagram of an example implementation of the example memory write controller of FIG. 1.

FIG. 2 is a block diagram of an example implementation of the example memory write controller 180 of FIG. 1, disclosed herein, to control programming of the example FAMOS memory array 100 of FIG. 1. While the example memory write controller 180 of FIG. 2 is described in conjunction with the example FAMOS memory array 100 of FIG. 1, the memory write controller 180 of FIG. 2 may be utilized to control any FAMOS memory array. The example memory write controller 180 of FIG. 2 is implemented in a printing device (e.g., an ink-jet printer, a laser printer, etc.) to control a FAMOS memory array (e.g., the example FAMOS memory array 100) in a memory of a printing cartridge installed in and communicatively coupled to the printing device. Alternatively, some or all of the components of the memory write controller 180 may be implemented on the printing cartridge (e.g., on the die of an example memory).

The memory write controller 180 of FIG. 2 includes an example write handler 230. The example write handler 230 receives instructions to write a bit(s) (e.g., the FAMOS memory bit 122) of the FAMOS memory array 100 of FIG. 1. The example write handler 230 controls an example line selector 210 and an example voltage regulator 220. The write handler 230 determines which FAMOS memory bit (e.g., the FAMOS memory bit 122) to program and when to program the FAMOS memory bit 122. The write handler 230 sends the programming instructions and FAMOS memory bit information to the line selector 210 and the voltage regulator 220.

The example line selector 210, equipped with FAMOS memory bit information, determines which row select transistors (e.g., the example row select transistors 124, 125 of FIG. 1) and column select transistor (e.g., the example column select transistor 150) are associated with the FAMOS memory bit determined to be written. The example line selector 210 activates the determined row select transistors 124, 125 and the column select transistor 160 by sending a voltage to the row select line 123 and the column select line 155 associated with the determined row select transistors 124, 125 and the column select transistor 160. In some examples, the line selector 210 progressively increases, or steps, the voltage sent to the gates of the determined row select transistor 124, 125 to control the amount of current flow through the FAMOS memory bit 122, as described further in conjunction with FIG. 5 and the flowchart of FIG. 10.

The example voltage regulator 220 controls the programming voltage $V_{prog}$ 110. In some examples, the voltage regulator 220 steps the programming voltage $V_{prog}$ 110 to a read voltage level $V_{read}$ (e.g., 5V) followed by a step to a write voltage $V_{write}$ level (e.g., 10V), as further described in conjunction with FIGS. 3A, 3B, and 3C and the flowchart of FIG. 8. In other examples, the voltage regulator 220 is slew rate controlled to apply a slowly increased programming voltage $V_{prog}$ 110, as further described in conjunction with FIG. 4 and the flowchart of FIG. 9. By progressively increasing the programming voltage $V_{prog}$ 110 to the write voltage level $V_{write}$, parasitic current is reduced and prevents inadvertent programming of unselected FAMOS memory bits (e.g., the example FAMOS memory bit 121).

In operation, when the write handler 230 receives instructions to program a FAMOS memory bit of the example FAMOS memory array 100, the write handler 230 determines which FAMOS memory bit (e.g. the FAMOS memory bit 122) is to be programmed. The write handler 230 sends write instructions to the voltage regulator 220 and sends the bit information to the line selector 210. The example line selector 210 receives the bit information and determines which row select transistors 124, 125 of FIG. 1 and column select transistors 150 correlate to the FAMOS memory bit 122 to be programmed and activates the row select transistors 124, 125 and column select transistor 150. The example voltage regulator 220 receives the write instructions and executes the write voltage sequence in accordance to FIG. 3A and/or FIG. 4.

Figure 3A:
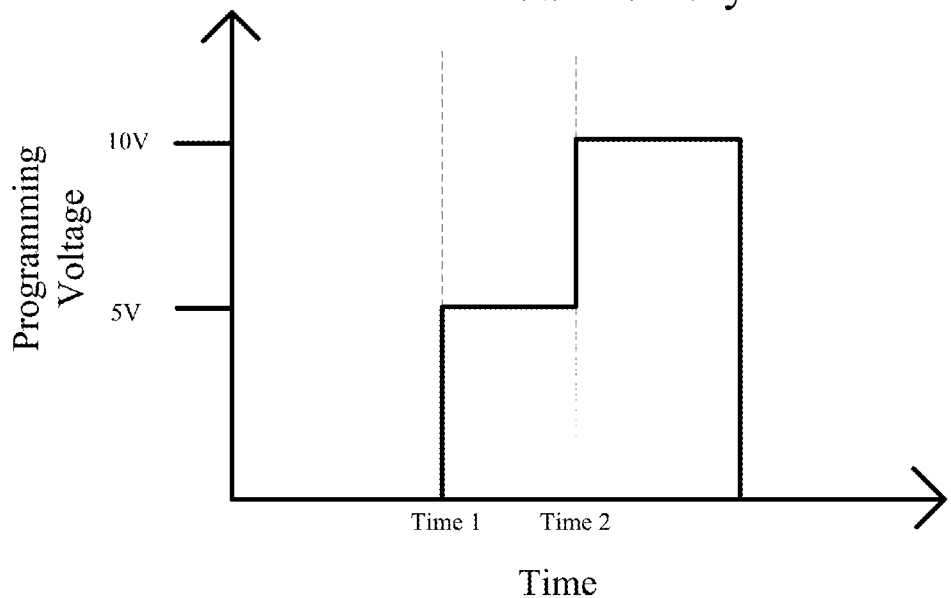
FIG. 3A is a graph illustrating a programming voltage for the example FAMOS memory array of FIG. 1 in accordance with the disclosure.

FIG. 3A illustrates an example programing voltage $V_{prog}$ 110 that may be output by the example voltage regulator 220 of FIG. 2 to program a FAMOS memory bit (e.g., the example FAMOS memory bit 122) of the example FAMOS memory array 100 of FIG. 1. An example method for generating the example programming voltage $V_{prog}$ 110 of FIG. 3A is described in conjunction with the example flowchart of FIG. 8. According to the illustrated example, when the example write handler 230 receives an instruction to program the example FAMOS memory bit 122 and instructs the voltage regulator 220 to output a programming voltage $V_{prog}$ 110 (e.g., at Time 1), the example voltage regulator 220 outputs the programming voltage $V_{prog}$ 110 at a read voltage level $V_{read}$, which is 5V according to the illustrated example. At a later time (e.g., at Time 2) (e.g., 10 μs after Time 1), the example voltage regulator 220 increases the programming voltage $V_{prog}$ 110 to a write voltage level $V_{write}$, which is 10V according to the illustrated example. Once a sufficient time has passed for programming (e.g., 10 μs), the voltage regulator 220 returns the programming voltage $V_{prog}$ 110 to a disabled state (e.g. 0V).

Figure 3B:
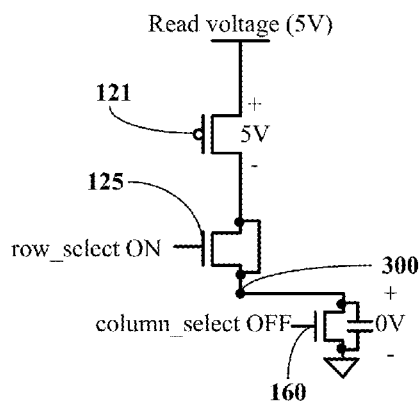
FIGS. 3B and 3C are example schematics illustrating the results of applying the programming voltage of FIG. 3A to a bit of a FAMOS memory array.
Figure 3C:
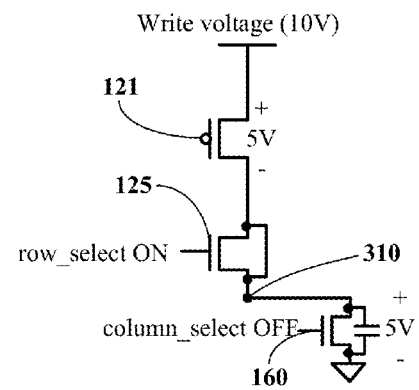

FIGS. 3B and 3C illustrate the results of applying the programming voltage of FIG. 3A to a non-selected FAMOS memory bit (e.g., the example FAMOS memory bit 121). FIG. 3B illustrates the result of applying the programming voltage $V_{prog}$ of FIG. 3A on the example FAMOS memory bit 121 at Time 1. According to the illustrated example, at Time 1, the example row select transistor 125 is activated because the row select line 123 is also connected to a FAMOS memory bit that is to be programmed (e.g., the example FAMOS memory bit 122). The column select transistor 160 is deactivated, which acts as an open circuit to ground because the example FAMOS memory bit 121 is not selected for programming. The pulse in the programming voltage $V_{prog}$ 110 to 5V causes the example parasitic capacitance 140 to act like a short to ground as shown in FIG. 3B. Since both the row select transistor 125 and the column select transistor 160 temporarily act like shorts when the programming voltage $V_{prog}$ 110 is pulsed to 5V, the node voltage 300 is 0V. Thus, the voltage drop across the non-selected FAMOS memory bit 121 is 5 V (e.g., 5V–0V =5V). Because 5V is not sufficient to cause an avalanching injection current in the example FAMOS memory bit 121, the example FAMOS memory bit 121 is not programmed by the programming voltage $V_{prog}$ 110 at Time 1.

FIG. 3C illustrates the results of applying the example programming voltage $V_{prog}$ 110 of FIG. 3A on the example FAMOS memory bit 121 at Time 2. From Time 1 to Time 2, the parasitic capacitance of the column select transistor 160 has charged, creating a 5V potential at node 310, as shown in FIG. 3C. While the node voltage at node 310 is 5V, the corresponding node voltage for the example FAMOS memory bit 122 that is to be programmed remains at 0V because the example column select transistor 160 is activated to provide a path to ground and, thus, the parasitic capacitance associated with the example FAMOS memory bit 122 that is to be programmed is not charged. Thus, the node voltage at node 310 is greater than the corresponding node voltage of the example FAMOS memory bit 122 that is to be programmed.

At Time 2, the programming voltage $V_{prog}$ 110 is pulsed from 5V to 10V. Thus, the voltage drop across the non-selected FAMOS memory bit 121 is 5V (e.g., 10V–5V=5V). Because 5V is not sufficient to cause an avalanching injection current in the example FAMOS memory bit 121, the example FAMOS memory bit 121 is not programmed by the programming voltage at Time 2, as intended.

An advantage of the example programming voltage $V_{prog}$ 110 of FIG. 3A is that existing voltage regulators already include circuitry to output the programming voltage $V_{prog}$ 110 at the read voltage level $V_{read}$ (e.g., for using during reading of a bit) and the $V_{write}$ level (e.g., for programming a bit). Accordingly, modifying an existing device to output the programming voltage $V_{prog}$ 110 according to FIG. 3A may be performed without the need to modify the circuitry of the existing voltage regulator.

Figure 4:
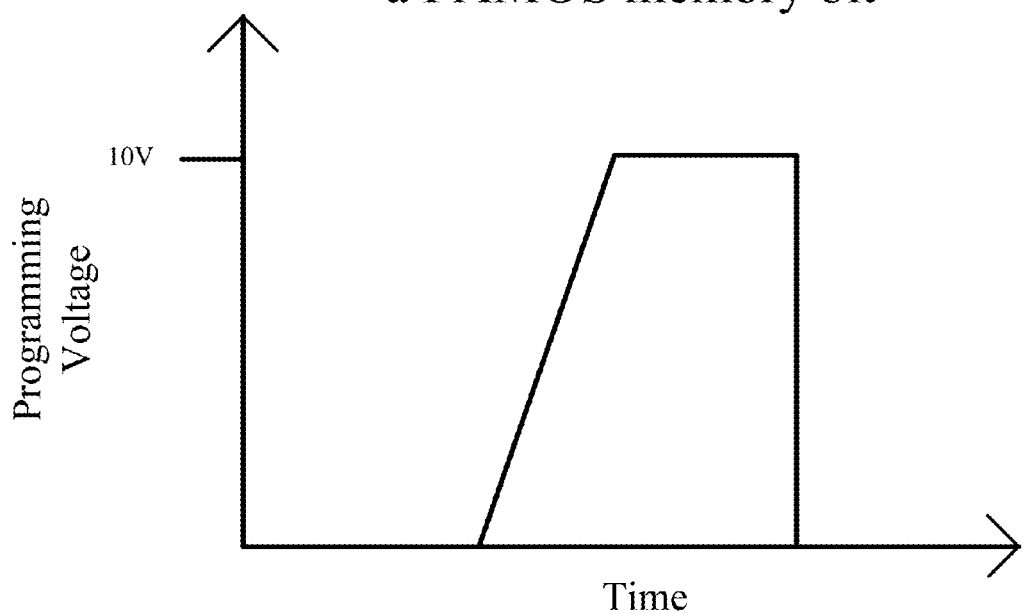
FIG. 4 is a graph illustrating another programming voltage for the example FAMOS memory array of FIG. 1 in accordance with the disclosure.

FIG. 4 illustrates another example programming voltage $V_{prog}$ 110 that may be output by the example voltage regulator 220 of FIG. 2 to program the example FAMOS memory bit 122 of the example FAMOS memory array 100 of FIG. 1. An example method for generating the example programming voltage $V_{prog}$ 110 of FIG. 4 is described in conjunction with the example flowchart of FIG. 9. According to the illustrated example of FIG. 4, when the example write handler 230 receives an instruction to program the example FAMOS memory bit 122 and instructs the voltage regulator 220 to output a programming voltage $V_{prog}$ 110, the example voltage regulator 220 outputs a slew rate controlled programming voltage $V_{prog}$ 110 that progressively increases to the write voltage level $V_{write}$ of the FAMOS memory bit 122 (e.g., 10V). The programming voltage $V_{prog}$ 110, according to the illustrated example of FIG. 4, increases progressively at a slower rate than prior art pulsed programming voltages. Changing the rate of increase for the programming voltage $V_{prog}$ 110 reduces the effects of parasitic current flow on non-selected FAMOS memory bits (e.g., the example FAMOS memory bit 121). Parasitic current is proportional to the rate of change of the programming voltage according to the equation (e.g., $$i = C\frac{dv}{dt}\Bigr).$$

According to the illustrated example, the example voltage regulator 220 causes the rate of voltage change to be small enough that the parasitic current in the example non-selected FAMOS memory bit 121 is not large enough to cause the non-selected FAMOS memory bit 121 to be inadvertently programmed. While the node voltage at the drain of the example column select transistor 160 is slowly charged by the slew rate controlled programming voltage $V_{prog}$ 110, the corresponding node voltage at the drain of the example column select transistor 150 for the example FAMOS memory bit 122 that is to be programmed remains at 0V because the example column select transistor 150 is activated to provide a path to ground. Thus, the parasitic capacitance associated with the example FAMOS memory bit 122 that is to be programmed is not charged. Thus, the node voltage at the drain of the example column select transistor 160 is greater than the corresponding node voltage of the example FAMOS memory bit 122 that is to be programmed.

Figure 5:
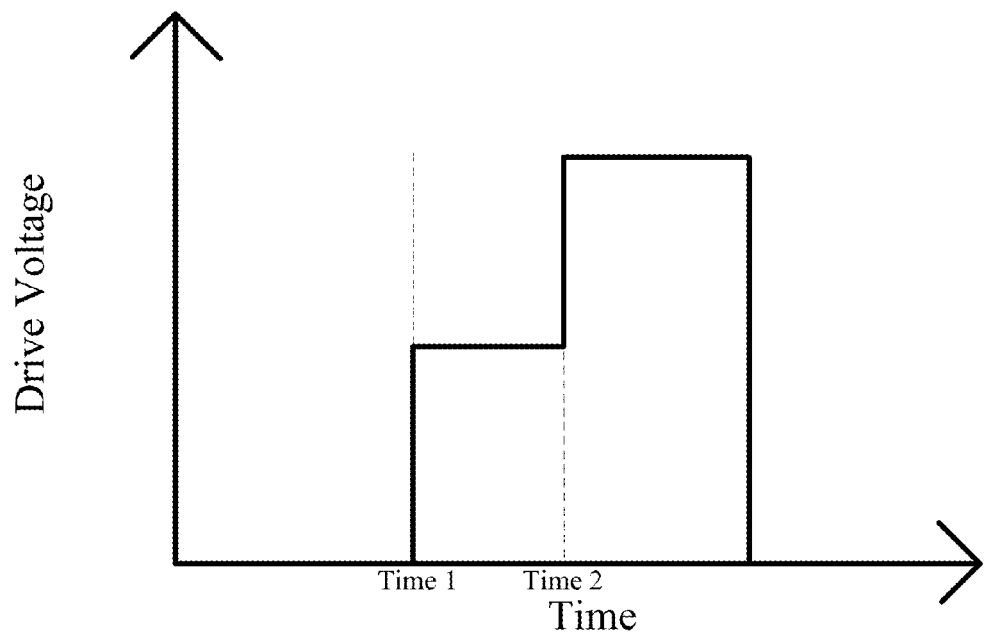
FIG. 5 is a graph illustrating a drive voltage for controlling a gate of a row select transistor of the example FAMOS memory array of FIG. 1 in accordance with the disclosure.

FIG. 5 illustrates an example drive voltage output by the example line selector 210 of FIG. 2 to control the example row select line 123 of FIG. 1, which is coupled to the gates of the example row select NMOS transistors 124, 125 that select the FAMOS memory block 120 and/or the example FAMOS memory block 130. When a bit of the FAMOS memory array 100 (e.g., the FAMOS memory bit 122) is to be programmed, the corresponding row select line (e.g., the example row select line 123) is activated. According to the illustrated example of FIG. 5, the example line selector 210 controls the drive strength voltage on the gate of the row select NMOS transistors 124, 125 (e.g., to partially activate the NMOSs) to step up the drive strength voltage in at least two increments. Stepping up the drive strength voltage in increments will charge the parasitic capacitance, represented by capacitors 140, while limiting the current that can flow through the FAMOS memory array 100, thus eliminating a short to ground for non-selected FAMOS memory bit(s) (e.g., the FAMOS memory bit 121). Without a path to ground, the non-selected FAMOS memory bit(s) will not be inadvertently programmed. Alternatively, the drive strength voltage could be ramped up from 0V to a full drive strength voltage (e.g., 5V).

Figure 6:
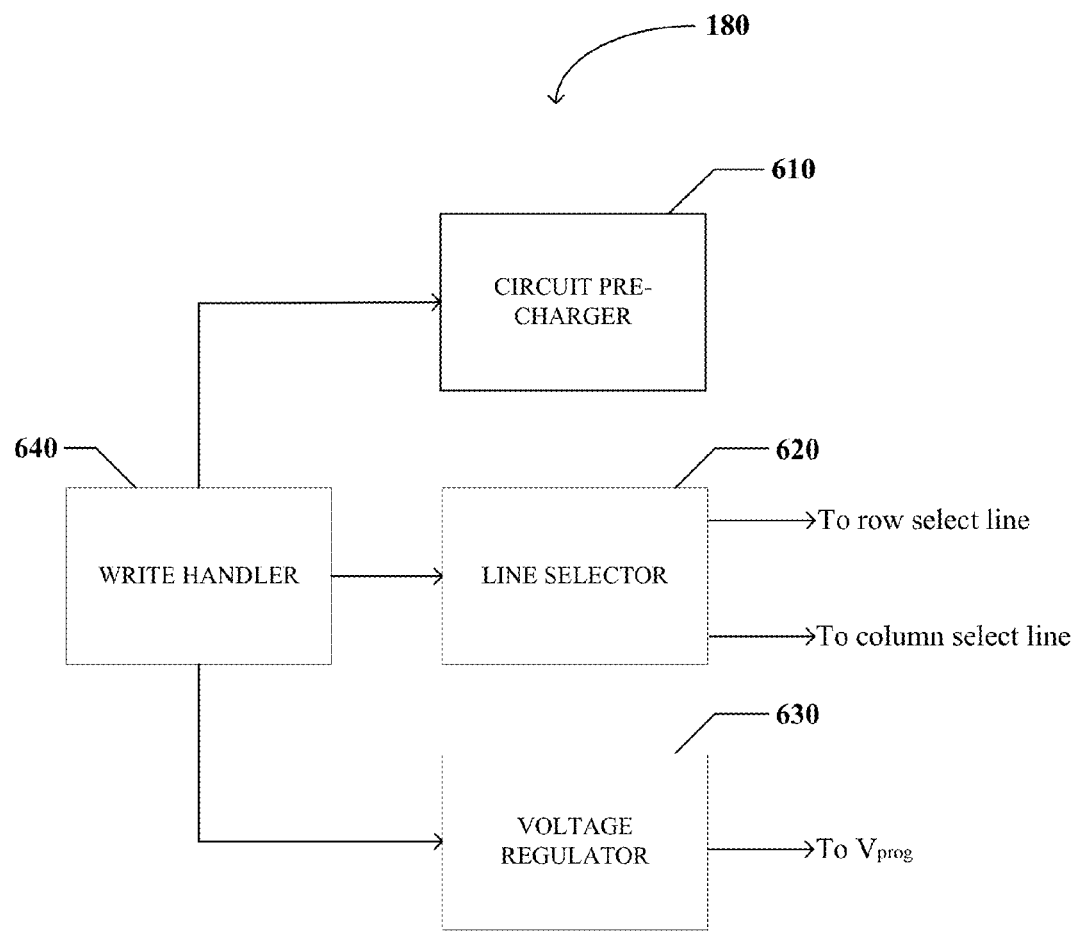
FIG. 6 is a block diagram of another example memory write controller to program a bit of the example FAMOS memory array of FIG. 1.

FIG. 6 is a block diagram of an implementation of the example memory write controller 180 of FIG. 1, disclosed herein, to control programming of the example FAMOS memory array 100 of FIG. 1. While the example memory write controller 180 of FIG. 6 is described in conjunction with the example FAMOS memory array 100 of FIG. 1, the memory write controller 180 of FIG. 6 may be utilized to control FAMOS memory array. The example memory write controller 180 of FIG. 6 is implemented in a printing device (e.g., an ink-jet printer, a laser printer, etc.) to control a FAMOS memory array (e.g., the example FAMOS memory array 100) in a memory of a printing cartridge installed in and communicatively coupled to the printing device. Alternatively, some or all of the components of the memory write controller 180 may be implemented on the printing cartridge (e.g., on the die of example memory).

The memory write controller 180 of FIG. 6 includes an example write handler 640. The example write handler 640 receives instructions to program a FAMOS memory bit(s) (e.g., the FAMOS memory bit 122) of the FAMOS memory array 100 of FIG. 1. The example write handler 230 controls an example circuit pre-charger 610, an example line selector 620, and an example voltage regulator 630. The write handler 640 determines which FAMOS memory bit to program and when to program it. The write handler 640 outputs the programming instructions and FAMOS memory bit information to the circuit pre-charger 610, the line selector 620, and the voltage regulator 630.

The example circuit pre-charger 610 is activated when it receives the programming instructions from the write handler 640. The circuit pre-charger is a circuit that provides a charge to the parasitic capacitance 140 of FIG. 1. The example circuit pre-charger sends a voltage to the node at a drain of the column select transistors 150, 160. The voltage charges the parasitic capacitance before the voltage regulator 630 pulses the programming voltage $V_{prog}$ 110, eliminating inadvertent programming of non-selected FAMOS memory bits (e.g., the FAMOS memory bit 121).

The line selector 620, equipped with FAMOS memory bit information, determines which row select transistors 124, 125 and column select transistor 150 are associated with the determined FAMOS memory bit 122. The line selector 620 activates the determined row select transistors 124, 125 and column select transistor 150 by sending a voltage to the row select line 123 and the column select line 155 associated with the determined row select transistor 124, 125 and column select transistor 150.

The example voltage regulator 630, equipped with the programming instructions, controls the programming voltage $V_{prog}$ 110. The voltage regulator 630 steps the programming voltage $V_{prog}$ 110 to a write voltage $V_{read}$ (e.g., 10V). Alternatively, the voltage regulator 630 may utilize the example programming voltage $V_{prog}$ 110 described in conjunction with FIGS. 3A and 8, the example programming voltage $V_{prog}$ 110 described in conjunction with FIGS. 4 and 9, or any other programming voltage or sequence.

When the write handler 640 receives instructions to program, the write handler 640 determines which FAMOS memory bit (e.g., the FAMOS memory bit 122) is to be programmed. The write handler 640 sends write instructions to the circuit pre-charger 610 to activate the circuit pre-charger 610. The write handler also sends the write instructions to the voltage regulator 630 and sends the bit information to the line selector 620. The line selector 620 receives the bit information and determines which row select transistors 124, 125 of FIG. 1 and column select transistors 150 correlate to the FAMOS memory bit 122 to be programmed and activates the determined row select transistors 124, 125 and column select transistor 150. The voltage regulator 630 receives the write instructions and performs the write voltage sequence. For example, the voltage regulator 630 may output the programming voltage $V_{prog}$ 110 of FIG. 3A or FIG. 4, may output a pulsed programming voltage (e.g., a 10V pulse), etc.

Figure 7:
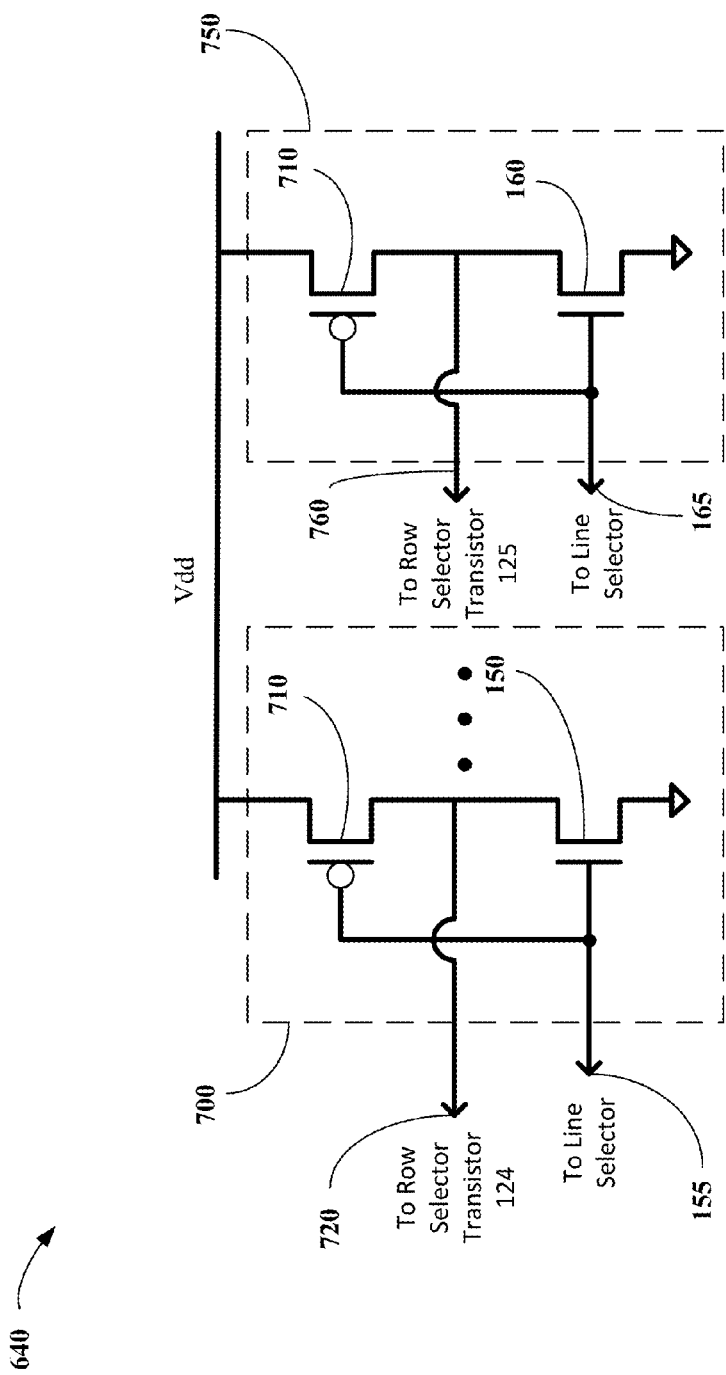
FIG. 7 is a schematic diagram of an example implementation of the circuit pre-charger of FIG. 6.

FIG. 7 illustrates an example circuit to implement the example circuit pre-charger 640 or FIG. 6. According to the illustrated example, the example circuit pre-charger 640 coupled to the drain of the column select transistors 150, 160 of the example FAMOS memory array 100 of FIG. 1 to pre-charge the node between a source of the row select transistor 125 and a drain of the column select transistor 160 so that the source-to-drain voltage on the FAMOS memory bit 121 is not high enough to induce avalanche injection current.

The example circuit pre-charger 640 of FIG. 6 comprises bit pre-chargers 700, 750. The example bit pre-chargers 700, 750 comprise a pair of complementary transistors 710, 150/160 (e.g., when the example transistor 150 is activated, the corresponding transistor 710 is deactivated). The sources of the row select transistors 124, 125, of FIG. 1, are connected to bit line 720 and the bit line 760, respectively. The gates of the transistors 710 and 150/160 are coupled together to a column select line 155. When the voltage on column select line 155 is low (e.g. 0V) the column select transistor 150 is deactivated. If the column select transistor 150 is deactivated, the example inverted transistor 710 (e.g., when the gate of the transistor is provided a high voltage the transistor is deactivated and when the gate of the transistor is provided a low voltage the transistor is activated) is activated supplying 5V from Vdd to charge the parasitic capacitance 140 of FIG. 1 of the column select transistor 150. When the voltage on the column select line 155 is high (e.g. 5V-10V) the column select transistor 150 is activated. When the column select transistor 150 is activated, the inverted transistor 710 is deactivated allowing for the programming voltage $V_{prog}$ 110 of FIG. 1 to program the FAMOS memory bit 121 without inadvertently writing to the non-selected FAMOS memory bit 122.

When the circuit pre-charger 640 is activated to pre-charge the circuitry associated with the example column select transistor 160 and not activated to pre-charge the circuitry associated with the example column select transistor 150 (e.g., when the FAMOS memory bit 122 has been selected for programming and the FAMOS memory bit 121 has not been selected for programming), the node voltage at the drain of the example column select transistor 160 is greater than the corresponding node voltage at the drain of the column select transistor 150 associated with the example FAMOS memory bit 122 that is to be programmed.

Although an example implementation of the example pre-charger circuit 640 of FIG. 6 is illustrated in FIG. 7, other circuits and/or components may be utilized to implement as the circuit pre-charger 640. The circuit pre-charger 640 may be implemented by any circuit, including any combination of hardware and/or firmware that charges the parasitic capacitance 140 of the FAMOS memory array 100 of FIG. 1 prior to a programming operation.

While example manners of implementing the example memory write controller 180 of FIG. 1 are illustrated in FIGS. 2 and 6, elements, processes and/or devices illustrated in FIGS. 2 and 6 may be combined, divided, re-arranged, omitted, eliminated and/or implemented in any other way. Further, the example write handler 230, the example line selector 210, the example voltage regulator 220, and/or, more generally, the example memory write controller 180 of FIG. 2, the example write handler 640, the example pre-charging circuit 610, the example line selector 620, the example voltage regulator 630 and/or, more generally, the example memory write controller 180 of FIG. 6 may be implemented by hardware, machine readable instructions, software, firmware and/or any combination of hardware, machine readable instructions, software and/or firmware. Thus, for example, any of the example write handler 230, the example line selector 210, the example voltage regulator 220, and/or, more generally, the example memory write controller 180 of FIG. 2, the example write handler 640, the example pre-charging circuit 610, the example line selector 620, the example voltage regulator 630 and/or, more generally, the example memory write controller 180 of FIG. 6 could be implemented by analog and/or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, the example write handler 230, the example line selector 210, the example voltage regulator 220, and/or, more generally, the example memory write controller 180 of FIG. 2, the example write handler 640, the example pre-charging circuit 610, the example line selector 620, the example voltage regulator 630 and/or, more generally, the example memory write controller 180 of FIG. 6 is/are hereby expressly defined to include a tangible computer readable storage device or storage disk such as a memory, a digital versatile disk (DVD), a compact disk (CD), a Blu-ray disk, etc. storing the software and/or firmware. Further still, the example memory write controller 180 of FIG. 2 and/or the example memory write controller 180 of FIG. 6 may include elements, processes and/or devices in addition to, or instead of, those illustrated in FIGS. 8-11, and/or may include more than one of any or all of the illustrated elements, processes and devices.

Flowcharts representative of example machine readable instructions for implementing the memory write controller 180 of FIG. 2 and the example memory write controller 180 of FIG. 6 are shown in FIG. 8-11. In the examples, the machine readable instructions comprise a program for execution by a processor such as the processor 1212 shown in the example processor platform 1200 discussed below in connection with FIG. 12. The program may be embodied in machine readable instructions stored on a tangible computer readable storage medium such as a CD-ROM, a floppy disk, a hard drive, a digital versatile disk (DVD), a Blu-ray disk, or a memory associated with the processor 1212, but the entire program and/or parts thereof could alternatively be executed by a device other than the processor 1212 and/or embodied in firmware or dedicated hardware. Further, although the example program is described with reference to the flowcharts illustrated in FIGS. 8-11, many other methods of implementing the example memory write controller 180 of FIG. 2 and the example memory write controller 180 of FIG. 6 may alternatively be used. For example, the order of execution of the blocks may be changed, and/or some of the blocks described may be changed, eliminated, or combined.

As mentioned above, the example processes of FIGS. 8-11 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 8-11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 8:
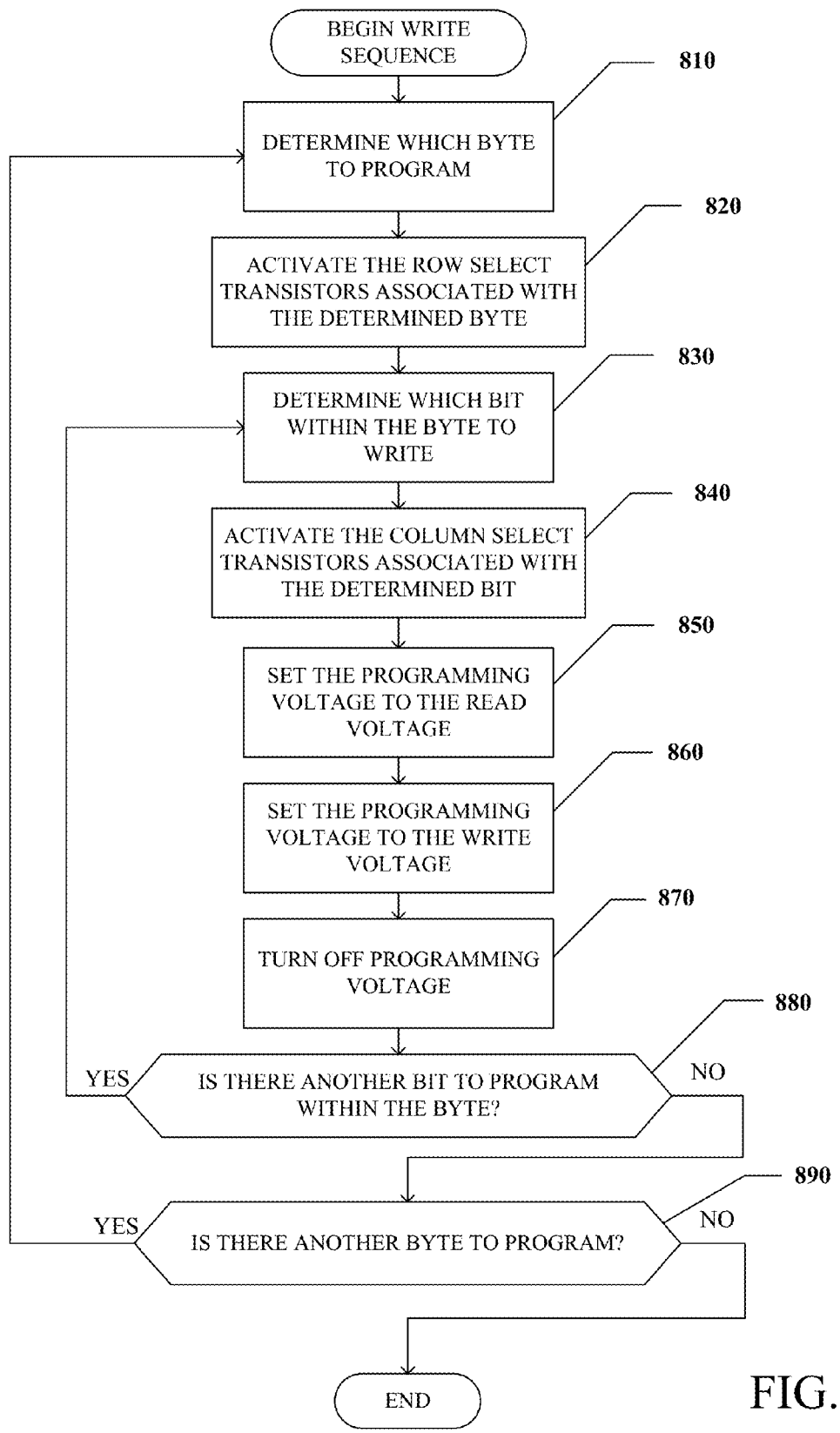
FIGS. 8-11 are flowcharts representative of example machine readable instructions that may be executed to implement the memory write controller of FIG. 2 and/or FIG. 6.

The example machine readable instructions illustrated in FIG. 8, may be executed to cause the memory write controller 180 of FIG. 2 to output the programming voltage described in conjunction with FIG. 3A. Although the flowchart of FIG. 8 depicts example steps in a given order, these steps are not exhaustive, various changes and modifications may be affected by one skilled in the art within the spirit and scope of the disclosure. For example, blocks illustrated in the flowchart in the flowchart may be performed in an alternative order or may be performed in parallel.

The method of FIG. 8 begins when the example write handler 230 of FIG. 2 receives an instruction to program a FAMOS memory bit or bits (e.g., the example FAMOS memory bit 122 of FIG. 1). At block 810, the example line selector 210 determines which memory block (e.g., memory block 120) is associated with the FAMOS memory bit 122 that is to be programmed, and which set of row select transistors (e.g., row select transistors 124, 125 of FIG. 1) are associated with the memory block 120. The line selector 210 then activates the set of row select transistors 124, 125 that are associated with the determined memory block 120 (block 820). In a similar manner, the line selector 210 determines which column select transistor (e.g., column select transistor 150 of FIG. 1) is associated with the selected FAMOS memory bit 122 (block 830). At block 840, the line selector 210 activates the column select transistor 150 associated with the selected FAMOS memory bit 122.

At block 850 of FIG. 8, the example write handler 230 outputs a signal to the voltage regulator 220 to output the example programming voltage $V_{prog}$ 110 sequence of FIG. 3A. The voltage regulator 220 sets the programming voltage $V_{prog}$ 110 to the read voltage level $V_{read}$ (e.g., 5V). At block 860, the voltage regulator 220 sets the programming voltage $V_{prog}$ 110 to the write voltage level $V_{write}$ (e.g., 10V). Applying the write voltage level $V_{write}$ after activating the row transistors 124, 125 and column transistor 150 associated with the selected FAMOS memory bit 122 allows avalanching current to flow and program the selected FAMOS memory bit 122. At block 870, once the bit has been programmed, the voltage regulator 220 turns off the programming voltage $V_{prog}$ 110 to stop the flow of avalanching current within the FAMOS memory bit 122.

At block 880 of FIG. 8, the write handler 230 determines if there is another FAMOS memory bit (e.g., FAMOS memory bit 121) to program within the memory block 120. If there is another FAMOS memory bit 121 to program within the memory block 120, the write handler 230 returns to block 830 to activate the new FAMOS memory bit 121 and program it. If there is not another FAMOS memory bit to program within the memory block 120, the write handler 230 determines if there is another memory block (e.g., memory block 130) to program (block 890). If there is another memory block 130 to program, the example write handler 230 returns to control block 810 to activate a different set of transistors to program a FAMOS memory bit of the other memory block memory block 130. If there is not another memory block to program, the write sequence ends.

Figure 9:
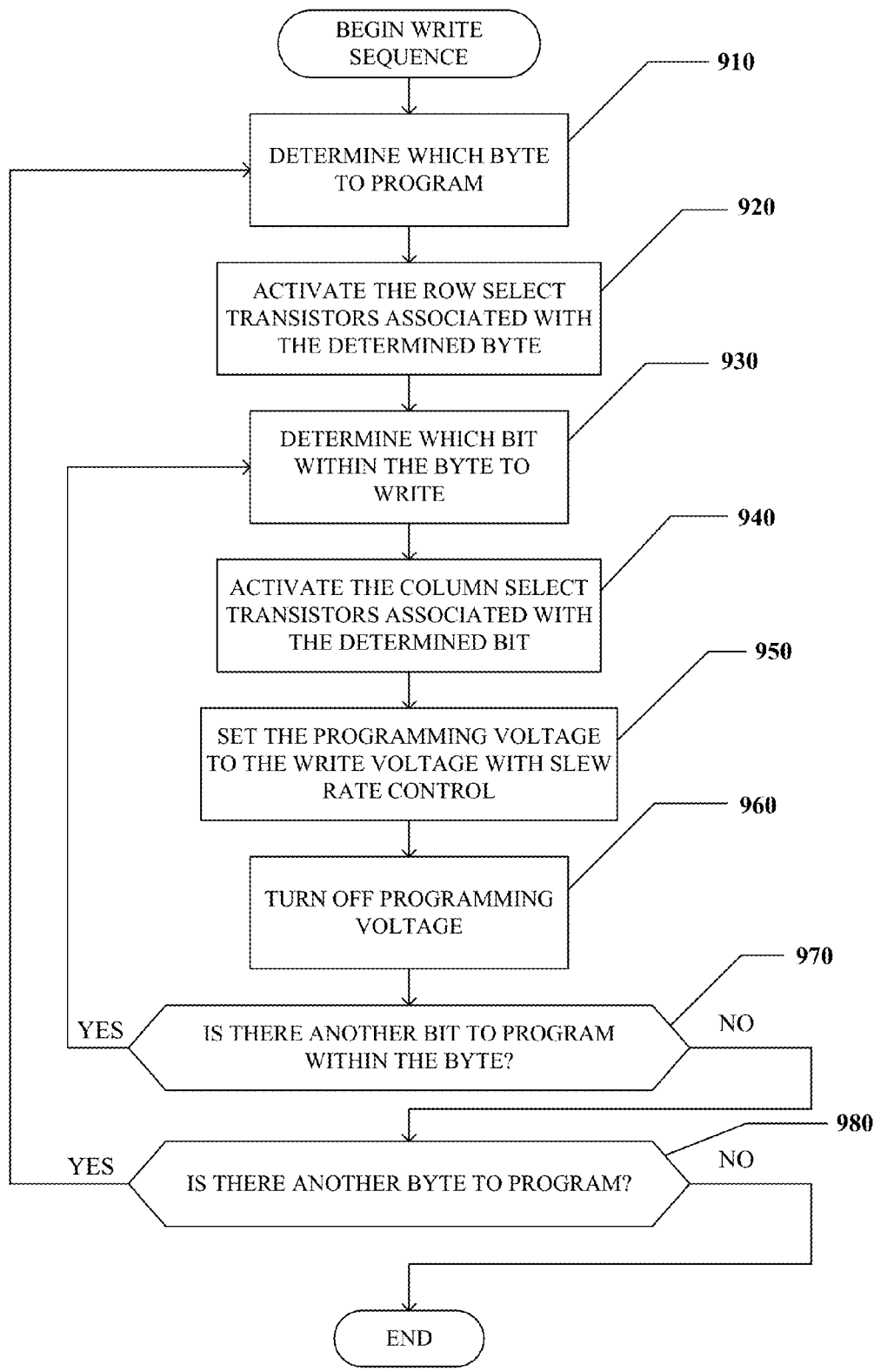

The example machine readable instructions illustrated in FIG. 9 may be executed to cause the memory write controller 180 of FIG. 2 to output the programming voltage $V_{prog}$ 110 for a FAMOS memory bit 122 as described in conjunction with FIG. 4. Although the flowchart of FIG. 9 depicts example steps in a given order, these steps are not exhaustive, various changes and modifications may be affected by one skilled in the art within the spirit and scope of the disclosure. For example, blocks in the flowchart may be performed in an alternative order or may be performed in parallel.

FIG. 9 begins when the example write handler 230 of FIG. 2 receives an instruction to program a FAMOS memory bit or bits (e.g., the example FAMOS memory bit 122 of FIG. 1). At block 910, the example line selector 210 determines which memory block (e.g., memory block 120) is associated with the FAMOS memory bit 122 that is to be programmed, and which set of row select transistors (e.g., row select transistors 124, 125 of FIG. 1) are associated with the memory block 120. The line selector 210 activates the set of row select transistors 124, 125 that are associated with the determined memory block 120 (block 920). In a similar manner, the line selector 210 determines which column select transistor (e.g., column select transistor 150) is associated with the FAMOS memory bit 122 (block 930). At block 940, the line selector 210 activates the column select transistor 150 associated with the FAMOS memory bit 122.

At block 950 of FIG. 9, the example write handler 230 sends a signal to the voltage regulator 220 to output a steadily increased slew rate controlled programming voltage $V_{prog}$ 110 to the write voltage level $V_{write}$ (e.g., 10V), as shown in FIG. 4. As opposed to stepping the voltage, which causes a large parasitic current through the parasitic capacitance (e.g., $$i = C\frac{dv}{dt},$$

when $$\frac{dv}{dt}$$

is high), increasing the voltage at a slower rate as illustrated in FIG. 4 decreases the parasitic current flow through the parasitic capacitance (e.g., $$i = C\frac{dv}{dt},$$

when $$\frac{dv}{dt}$$

is low). The slew rate controlled voltage can be applied by an analog voltage regulator to steadily increase the programming voltage, a change in circuitry, or by a using a large amount of steps that increase the voltage slowly until the write voltage level $V_{write}$ is achieved. Alternatively any method to slowly increase the programming voltage $V_{prog}$ 110, such that the parasitic capacitance is charged or the rate of the step of the programming voltage $V_{prog}$ 110 is lowered can be used.

Applying the write voltage level $V_{write}$ after activating the row select transistors 124, 125 and column select transistor 150 associated with the selected FAMOS memory bit 122 creates avalanching current to program the selected FAMOS memory bit 122. At block 960, once the bit is programmed, the voltage regulator 220 turns off the programming voltage $V_{prog}$ 110 to stop the flow of avalanching current within the FAMOS memory bit 122.

At block 970 of FIG. 9, the write handler 230 determines if there is another FAMOS memory bit (e.g., FAMOS memory bit 121) to program within the memory block 120. If there is another FAMOS memory bit 121 to program within the memory block 120, the write handler 230 returns control to block 930 to activate the new FAMOS memory bit and program it. If there is not another FAMOS memory bit to program within the memory block 120, the write handler 230 determines if there is another memory block (e.g., memory block 130) to program (block 980). If there is another memory block 130 to program, the write handler 230 returns control to block 910 to activate a different set of transistors to program a FAMOS memory bit of the other memory block 130. If there is not another memory block to program, the sequence ends.

Figure 10:
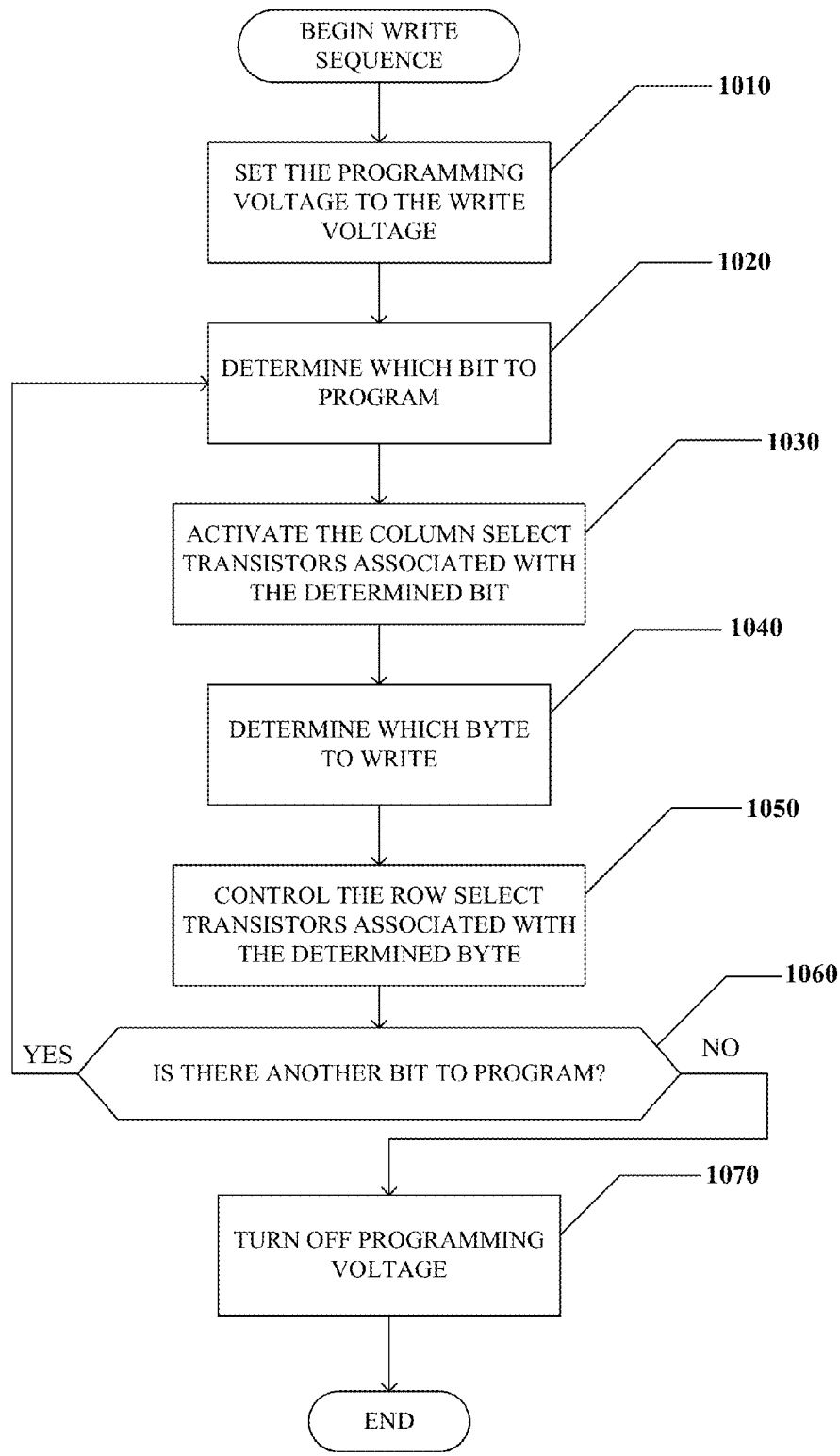

The example machine readable instructions illustrated in FIG. 10 may be executed to cause the memory write controller 180 of FIG. 2 to output the programming voltage $V_{prog}$ 110 for a FAMOS memory bit 122.

FIG. 10 begins when the example write handler 230 of FIG. 2 receives an instruction to program a FAMOS memory bit or bits (e.g., the example FAMOS memory bit 122 of FIG. 1). At block 1010, the example voltage regulator 220 receives instructions from the example write handler 230 and outputs a write voltage level (e.g., 10V) as the programming voltage $V_{prog}$ 110, as illustrated in FIG. 4. At block 1020, the line selector 210 determines which column select transistor (e.g., the column select transistor 150) associated with the example FAMOS memory bit 122 that is to be programmed. The line selector 210 then activates the column select transistor 150 that is associated with the FAMOS memory bit 122 (block 1030). In a similar manner, the line selector 210 determines which memory block (e.g., memory block 120) is to be programmed and which set of row select transistors (e.g., row select transistors 124, 125) are associated with the memory block 120 (block 1040). At block 1050, the write handler 230 controls the set of row select transistors 124, 125 associated with the determined memory block 120 to turn the set of row select transistor 124, 125 partially on to allow for a small amount of current to flow to charge the parasitic capacitance but not inadvertently program the non-select FAMOS memory bits (e.g., the FAMOS memory bit 121).

At block 1060, once the FAMOS memory bit 121 is programmed, the write handler 230 determines if there is another FAMOS memory bit (e.g., the FAMOS memory bit 121) to program. If there is another FAMOS memory bit 121 to program within the memory block 120, write handler 230 returns to block 1020 to activate the FAMOS memory bit 122 and program it. If there is not another FAMOS memory bit to program, the voltage regulator 220 turns off the programming voltage $V_{prog}$ 110 (block 1070) and the write sequence ends.

Figure 11:
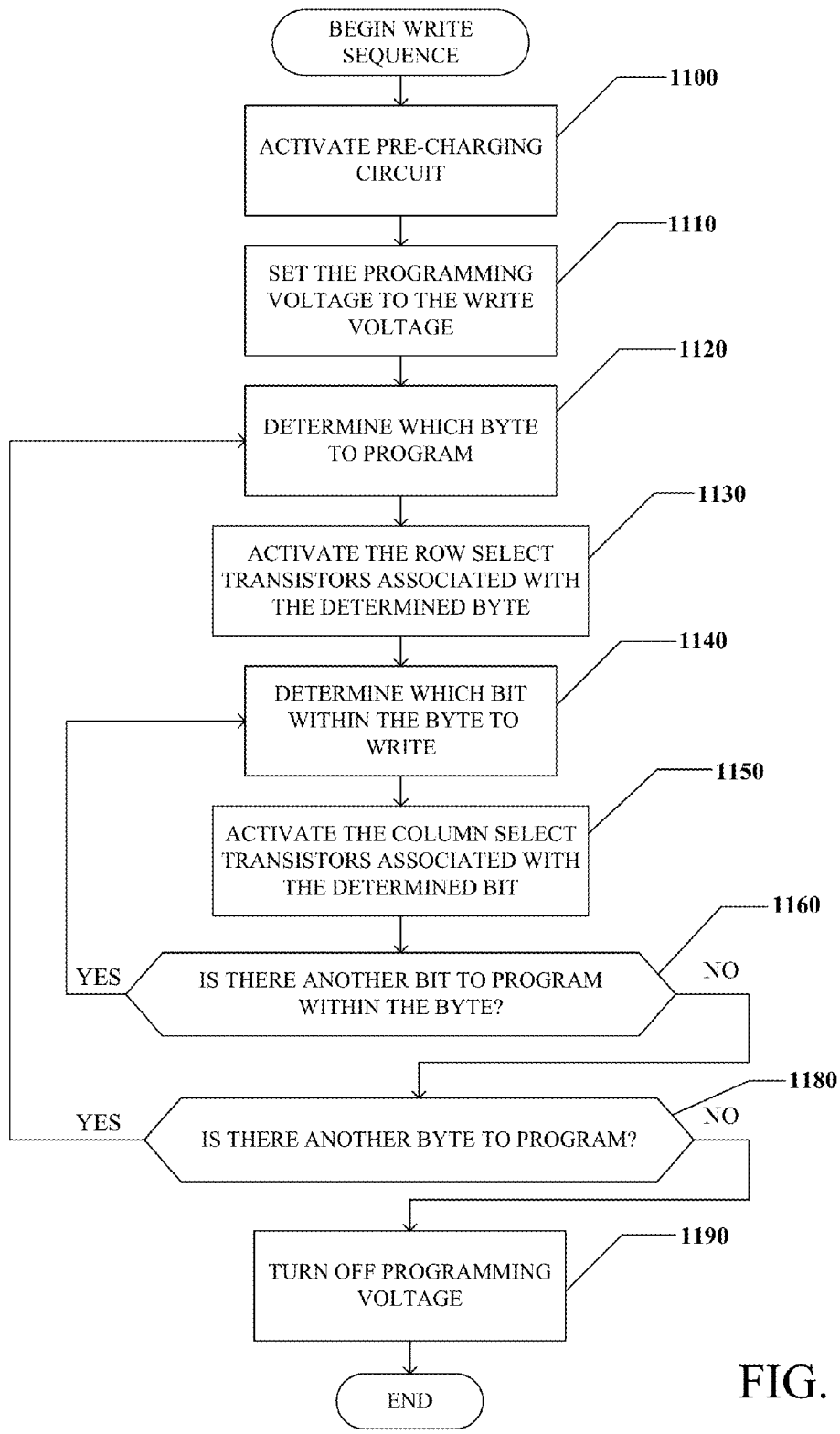

The example machine readable instructions illustrated in FIG. 11 may be executed to cause the memory write controller 180 of FIG. 6 to output the programming voltage $V_{prog}$ 110 for a FAMOS memory bit 122 as described in conjunction with FIGS. 6 and 7.

FIG. 11 begins when the example write handler 640 of FIG. 6 receives an instruction to program a FAMOS memory bit or bits (e.g., the example FAMOS memory bit 122 of FIG. 1). At block 1100, the example circuit pre-charger 640 is activated, charging a parasitic capacitance of the FAMOS memory array 100 of FIG. 3. Charging the parasitic capacitance eliminates the inadvertent programming of non-selected FAMOS memory bits (e.g., the FAMOS memory bit 121).

At block 1110, the example write handler 640 sends a signal to the voltage regulator 630 to output the example programming voltage. For example, the voltage regulator 630 may output the programming voltage $V_{prog}$ 110 of FIG. 3A or FIG. 4, may output a pulsed programming voltage (e.g., a 10V pulse), etc. The voltage regulator 630 sets the programming voltage $V_{prog}$ 110 to the write voltage level $V_{write}$ (e.g., 10V). At block 1120, the line selector 620 determines which memory block (e.g., memory block 120) is associated with the FAMOS memory bit (e.g., the FAMOS memory bit 122) that is to be programmed, and which set of row select transistors (e.g., row select transistors 124, 125) are associated with the selected memory block 120. The line selector 620 then activates the set of row select transistors 124, 125 that are associated with the determined memory block 120 (block 1130). In a similar manner, the line selector 620 determines which column select transistor (e.g., column select transistor 150) is associated with that FAMOS memory bit 122 (block 1140). At block 1150, the line selector 620 activates the set of column select transistor 150 associated with the FAMOS memory bit 122. As described in conjunction with FIG. 7, with the circuit pre-charger 610 activated, when the column select transistor 150 is activated the parasitic capacitance is charged, so that non-selected FAMOS memory bits (e.g., the FAMOS memory bit 121) will not be inadvertently programmed.

At block 1160, once the selected bit is written, the write handler 640 determines if there is another FAMOS memory bit (e.g., the FAMOS memory bit 121) to program within the memory block 120. If there is another FAMOS memory bit 121 to program within the memory block, the write handler 640 returns to block 1140 to activate the FAMOS memory bit 121 and program it. If there is not another bit to program within the memory block 120, the write handler 640 determines if there is another memory block (e.g., memory block 130) to program (block 1180). If there is another memory block 130 to program the write handler 640 returns to block 1120 in order to activate a different set of transistors to program a FAMOS memory bit of the other memory block 130. If there is not another bye to program the voltage regulator 630 turns off the programming voltage $V_{prog}$ 110 from the voltage regulator 220 and the write sequence ends (block 1190).

Figure 12:
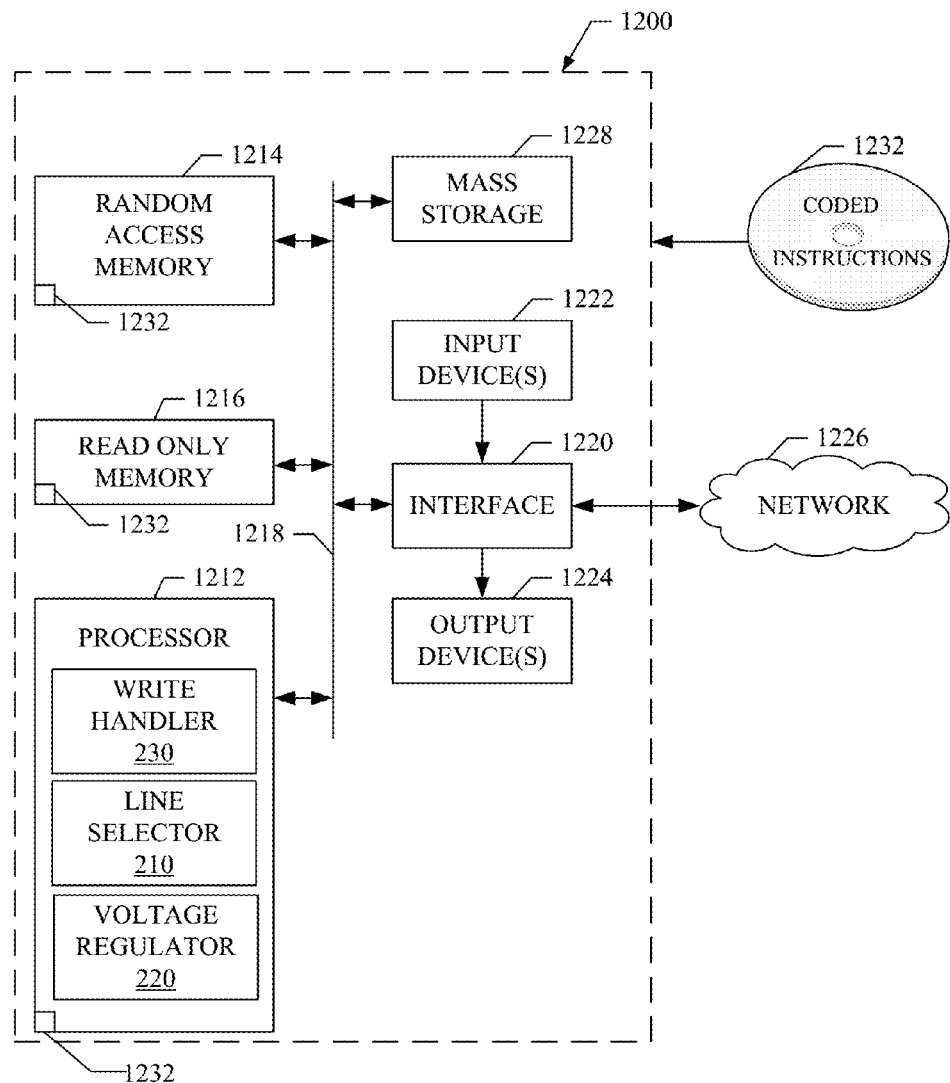
FIG. 12 is a block diagram of an example processor platform that may be utilized to execute the example instructions of FIGS. 8-10 to implement the memory write controller of FIG. 2.
Figure 13:
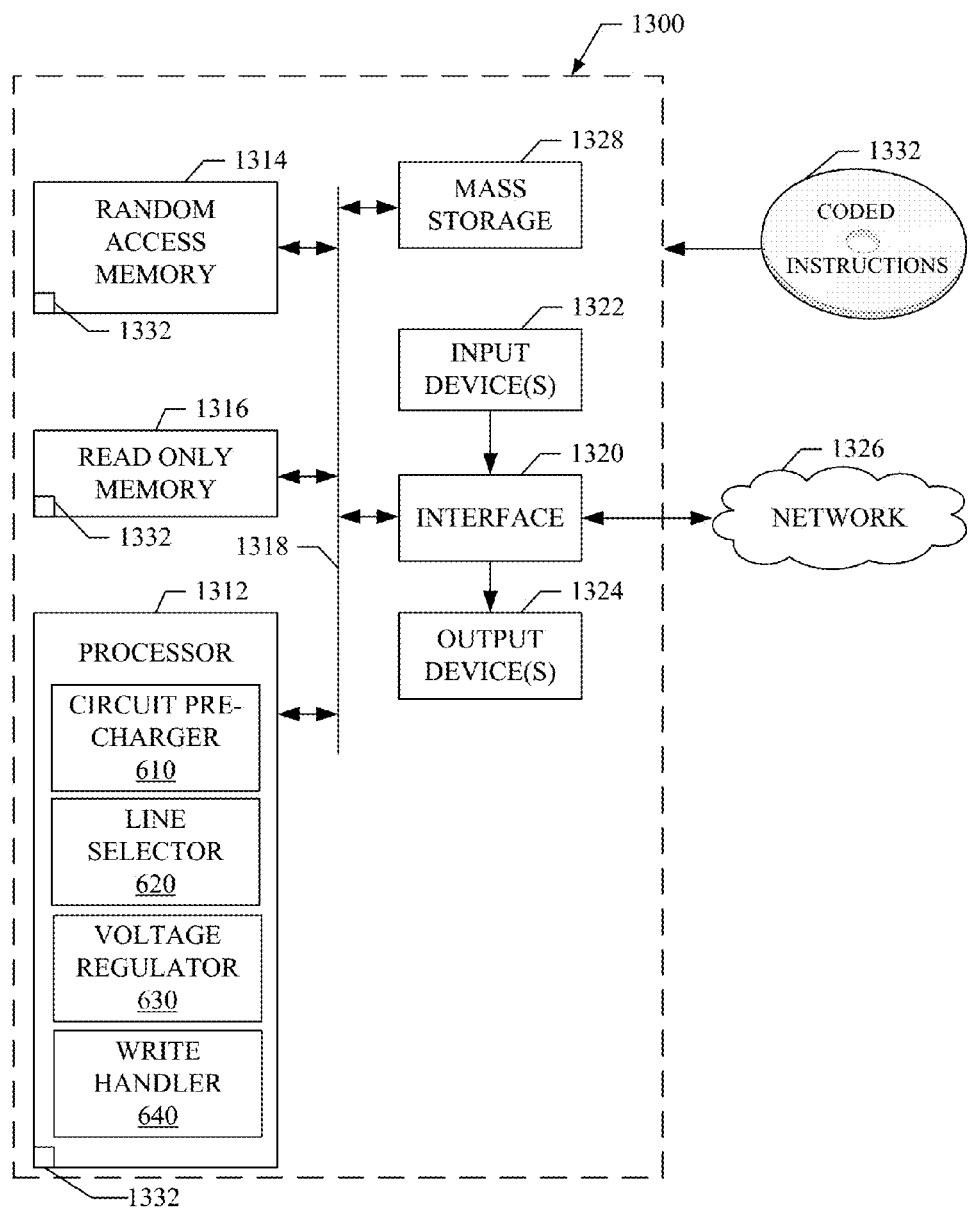
FIG. 13 is a block diagram of an example processor platform that may be utilized to execute the example instructions of FIG. 11 to implement the memory controller of FIG. 6.

FIG. 12 is a block diagram of an example processor platform 1200 capable of executing the instructions of FIGS. 11-13 to implement the example memory write controller 180 of FIG. 2. The processor platform 1200 can be, for example, a server, a personal computer, a mobile device (e.g., a cell phone, a smart phone, a tablet such as an iPad™), a personal digital assistant (PDA), an Internet appliance, or any other type of computing device.

The processor platform 1200 of the illustrated example includes a processor 1212. The processor 1212 of the illustrated example is hardware. For example, the processor 1212 can be implemented by integrated circuits, logic circuits, microprocessors and/or controllers from any desired family or manufacturer.

The example processor 1212 includes the example write handler 230, the example line selector 210, and the example voltage regulator 220 to implement the example memory write controller 180 of FIG. 2. The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), and/or a PCI express interface.

In the illustrated example, input devices 1222 are connected to the interface circuit 1220. The input device(s) 1222 permit(s) a user to enter data and commands into the processor 1212. The input device(s) can be implemented by, for example, a sensor, a microphone, a camera (still or video), a keyboard, a button, a mouse, a touchscreen, a track-pad, a trackball, isopoint and/or a voice recognition system.

Output devices 1224 are also connected to the interface circuit 1220 of the illustrated example. The output devices 1224 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1220 of the illustrated example, thus, typically includes a graphics driver card, a graphics driver chip or a graphics driver processor.

The interface circuit 1220 of the illustrated example also includes a communication device such as a transmitter, a receiver, a transceiver, a modem and/or network interface card to facilitate exchange of data with external machines (e.g., computing devices of any kind) via a network 1226 (e.g., an Ethernet connection, a digital subscriber line (DSL), a telephone line, coaxial cable, a cellular telephone system, etc.).

The processor platform 1200 of the illustrated example also includes mass storage devices 1228 for storing machine readable instructions and/or data. Examples of such mass storage devices 1228 include floppy disk drives, hard drive disks, compact disk drives, Blu-ray disk drives, RAID systems, and digital versatile disk (DVD) drives.

The coded instructions 1232 of FIGS. 11-13 may be stored in the mass storage device 1228, in the volatile memory 1214, in the non-volatile memory 1216, and/or on a removable tangible computer readable storage medium such as a CD or DVD.

FIG. 13 is a block diagram of an example processor platform 1300 capable of executing the instructions of FIG. 14 to implement the example memory write controller 180 of FIG. 6. The processor platform 1300 can be, for example, a server, a personal computer, a mobile device (e.g., a cell phone, a smart phone, a tablet such as an iPad™), a personal digital assistant (PDA), an Internet appliance, or any other type of computing device.

The processor platform 1300 of the illustrated example includes a processor 1312. The processor 1312 of the illustrated example is hardware. For example, the processor 1312 can be implemented by integrated circuits, logic circuits, microprocessors or controllers from any desired family or manufacturer.

The example processor 1312 includes the example circuit pre-charger 610, the example line selector 620, the example voltage regulator 630, and the example write handler 640 to implement the example memory write controller 180 of FIG. 6. The processor 1312 of the illustrated example is in communication with a main memory including a volatile memory 1314 and a non-volatile memory 1316 via a bus 1318. The volatile memory 1314 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1316 may be implemented by flash memory and/or any other desired type of memory device. Access to the main memory 1314, 1316 is controlled by a memory controller.

The processor platform 1300 of the illustrated example also includes an interface circuit 1320. The interface circuit 1320 may be implemented by any type of interface standard, such as an Ethernet interface, a universal serial bus (USB), and/or a PCI express interface.

In the illustrated example, input devices 1322 are connected to the interface circuit 1320. The input device(s) 1322 permit(s) a user to enter data and commands into the processor 1312. The input device(s) can be implemented by, for example, a sensor, a microphone, a camera (still or video), a keyboard, a button, a mouse, a touchscreen, a track-pad, a trackball, isopoint and/or a voice recognition system.

Output devices 1324 are also connected to the interface circuit 1320 of the illustrated example. The output devices 1324 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1320 of the illustrated example, thus, typically includes a graphics driver card, a graphics driver chip or a graphics driver processor.

The interface circuit 1320 of the illustrated example also includes a communication device such as a transmitter, a receiver, a transceiver, a modem and/or network interface card to facilitate exchange of data with external machines (e.g., computing devices of any kind) via a network 1326 (e.g., an Ethernet connection, a digital subscriber line (DSL), a telephone line, coaxial cable, a cellular telephone system, etc.).

The processor platform 1300 of the illustrated example also includes mass storage devices 1328 for storing machine readable instructions and/or data. Examples of such mass storage devices 1328 include floppy disk drives, hard drive disks, compact disk drives, Blu-ray disk drives, RAID systems, and digital versatile disk (DVD) drives.

The coded instructions 1332 of FIG. 13 may be stored in the mass storage device 1328, in the volatile memory 1314, in the non-volatile memory 1316, and/or on a removable tangible computer readable storage medium such as a CD or DVD.

From the foregoing, it will be appreciated that the above disclosed methods, apparatus and articles of manufacture enable a FAMOS memory bit to be programmed by a memory controller. Using the examples disclosed herein, a selected FAMOS memory bit is programmed without inadvertently programming non-selected bits as may occur using prior art techniques. In some examples, a programming voltage is stepped up in increments to limit the parasitic current flow through non-selected FAMOS memory when a write voltage level is ultimately applied. In some examples, the programming voltage can be ramped up to limit the parasitic current flow through non-selected FAMOS memory bits when a write voltage level is ultimately applied. In some examples, row select transistors are controlled to minimize parasitic current flow through non-selected FAMOS memory bits. In another example, a pre-charge circuit is provided to charge the parasitic capacitance in order to limit parasitic current flow through the non-selected FAMOS memory bits.

Inadvertently programming a FAMOS memory bit may cause irreversible loss of the bit when the bit cannot be erased once programmed. Loss of a bit is a significant disadvantage since the available memory on a printing cartridge may be limited. In some cases, an inadvertently programmed bit can corrupt the entire memory array causing the printing cartridge (or at least the memory) to be unusable and/or discarded. The disclosed methods, apparatus and articles of manufacture avoid inadvertently programming of non-selected FAMOS memory bits and therefore reduce the likelihood that bits will be made unusable and/or printing cartridges will be discarded.

While the example FAMOS memory arrays are described as being implemented on a printing cartridge in the foregoing examples, the methods and apparatus disclosed herein may be implemented in any other type of memory array.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method of programming a floating gate memory array, the method comprising:
    in response to a request to program a second bit of the floating gate memory array:
        at a first time, outputting a programming voltage to a first source terminal of a first transistor corresponding to a first bit to cause a first node voltage at a second source terminal of a second transistor corresponding to the first bit, the first node voltage being greater than a second node voltage at a third source terminal of a third transistor corresponding to the second bit; and
        at a second time, increasing the programming voltage of the floating gate memory array to program the second bit of the floating gate memory array.

2. The method of claim 1, wherein the outputting of the programming voltage at the first time includes outputting the programming voltage at a read voltage level that is applied to the floating gate memory array when reading the first bit.

3. The method of claim 1, wherein the programming voltage is progressively increased from the first time to the second time.

4. The method of claim 3, wherein the programming voltage is controlled via a voltage regulator on a printing device.

5. The method of claim 3, wherein the programming voltage is controlled to prevent parasitic current flow from programming the first bit that is not selected for programming.

6. The method of claim 1, wherein outputting the programming voltage utilizes a voltage source coupled to the first source terminal of the first transistor.

7. An apparatus for programming a floating gate memory array, the apparatus comprising:
    a write handler to receive requests to program a second bit of the floating gate memory array;
    a line selector to enable the second bit for programming;
    a voltage regulator to:
        output a programming voltage to a first source terminal of a first transistor corresponding to a first bit to cause a first node voltage at a second source terminal of a second transistor corresponding to the first bit at a first time, the first node voltage being greater than a second node voltage at a third source terminal of a third transistor corresponding to the second bit; and
        at a second time, increase the programming voltage of the floating gate memory array to program the second bit of the floating gate memory array.

8. The apparatus of claim 7, wherein the voltage regulator outputs the programming voltage at the first time by outputting the programming voltage at a read voltage level that is applied to the floating gate memory array when reading the first bit.

9. The apparatus of claim 7, wherein the voltage regulator controls the programming voltage to progressively increase from the first time to the second time.

10. The apparatus of claim 7, wherein the voltage regulator is on a printing device.

11. The apparatus of claim 10, wherein the voltage regulator controls the programming voltage to prevent parasitic current flow from programming the first bit that is not selected for programming.

12. The apparatus of claim 7, further including a pre-charging circuit to output a voltage signal to the second source terminal of the second transistor.

13. A tangible computer-readable medium comprising instructions that, when executed, cause a computing device to at least:
    in response to a request to program a second bit of a floating gate memory array:
        at a first time, output a programming voltage to a first source terminal of a first transistor corresponding to a first bit to cause a first node voltage at a second source terminal of a second transistor corresponding to the first bit, the first node voltage being greater than a second node voltage at a third source terminal of a third transistor corresponding to the second bit; and
        at a second time, increase the programming voltage of the floating gate memory array to program the second bit of the floating gate memory array.

14. The computer-readable medium of claim 13, wherein the instructions, when executed, cause the computing device to output the programming voltage at the first time by outputting the programming voltage at a read voltage level that is applied to the floating gate memory array when reading the first bit.

15. The computer-readable medium of claim 13, wherein the instructions, when executed, cause the computing device to output the programming voltage by progressively increasing the programming voltage from the first time to the second time.

* * * * *